US006618609B2

(12) United States Patent
Liu et al.

(10) Patent No.: US 6,618,609 B2
(45) Date of Patent: Sep. 9, 2003

(54) FLOW ADAPTIVE GUIDED DETERMINATION OF IMAGING PARAMETERS FOR 3D MAGNETIC RESONANCE ANGIOGRAPHY

(75) Inventors: Kecheng Liu, Solon, OH (US); Dee H. Wu, Shaker Heights, OH (US)

(73) Assignee: Koninklifke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/822,615

(22) Filed: Mar. 30, 2001

(65) Prior Publication Data

US 2002/0183613 A1 Dec. 5, 2002

(51) Int. Cl.⁷ .................................................. A61B 5/05
(52) U.S. Cl. ...................................................... 600/419
(58) Field of Search ................................ 600/419, 410; 324/306

(56) References Cited

U.S. PATENT DOCUMENTS

| 4,940,940 A | | 7/1990 | Leroux ......................... 324/309 |
| 5,031,624 A | * | 7/1991 | Mistretta et al. .............. 600/419 |
| 5,034,694 A | * | 7/1991 | Sattin et al. .................. 324/309 |
| 5,105,152 A | * | 4/1992 | Pauly .......................... 324/309 |
| 5,125,407 A | * | 6/1992 | Harms et al. ................. 600/410 |
| 5,133,357 A | * | 7/1992 | Dumoulin et al. ............. 600/413 |
| 5,285,158 A | * | 2/1994 | Mistretta et al. .............. 324/309 |
| 5,303,706 A | * | 4/1994 | Moshfeghi .................... 600/419 |
| 5,307,014 A | * | 4/1994 | Laub ........................... 324/306 |
| 5,447,155 A | * | 9/1995 | NessAiver et al. ............. 600/410 |
| 5,565,776 A | * | 10/1996 | Kanazawa ..................... 324/306 |
| 5,729,138 A | | 3/1998 | Purdy et al. ................... 324/309 |
| 5,770,943 A | | 6/1998 | Zhou ............................ 324/307 |
| 5,842,989 A | * | 12/1998 | Zur ............................. 600/410 |
| 5,891,032 A | * | 4/1999 | Harvey ........................ 600/419 |
| 6,009,341 A | | 12/1999 | Edelman ...................... 600/413 |
| 6,028,428 A | | 2/2000 | Cunnungham et al. ......... 324/314 |
| 6,301,497 B1 | * | 10/2001 | Neustadter ................... 600/410 |
| 6,389,304 B1 | * | 5/2002 | Van Den Brink et al. ..... 600/419 |

OTHER PUBLICATIONS

Laub, et al. "Variable–Tip–Angle Slab Selection for Improved Three–Dimensional MR Angiography", Siemens Medical systems, Iselin, NJ, pp. 86.
Purdy, et al. "The Design of Variable Tip Angle Slab Selection (TONE) Pulses for Improved 3–D MR Angiography", Siemens Medical systems, Iselin, NJ, pp. 882.
Wong et al. "Implementation of Quantitative Perfusion Imaging Techniques for Functional Brain Mapping using Pulsed Arterial Spin Labeling", NMR in Biomedicine, vol. 10, 237–249, 1997.
Priatna, et al. "Variable–Angle Uniform Signal Excitation (VUSE) for Three–Dimensional Time–of–Flight MR Angiography", SMR, Nov. 21, 1994 Angiography, Radiology 1997; 203:275–280.
Tkach, et al. "Use of Tilted Optimized Monsaturating Excitation (TONE) RF Pulses and MTC to Improve the Quality of MR Angiograms of the Carotid Bifurcation", pp. 3905.

* cited by examiner

*Primary Examiner*—Daniel Robinson
(74) *Attorney, Agent, or Firm*—Fay, Sharpe, Fagan, Minnich & McKee

(57) ABSTRACT

To image flowing materials, magnetic resonance preconditioning pulses are applied in an upstream region (28). For scanning a subject, an RF pulse calibration sequence is performed by generating a corresponding magnetic resonance data line ($36_1, \ldots, 36_n$) in each of a plurality of slices ($40_1, \ldots, 40_n$) along a vessel. A processor (54) determines a signal intensity for each slice (56), fits the intensities for the family of slices to a curve (58), and adjusts an RF pulse profile with spatial position in accordance with the curve which is dynamically dependent on the scanned subject. In a subsequent imaging sequence with the adjusted tip angles, data lines from each of the slices are received (52) and reconstructed (62) into an image representation stored in the memory (64).

26 Claims, 3 Drawing Sheets

FLOW ADAPTIVE GUIDED DETERMINATION OF IMAGING PARAMETERS FOR 3D MAGNETIC RESONANCE ANGIOGRAPHY

BACKGROUND OF THE INVENTION

The present invention relates to the diagnostic imaging arts. It finds particular application in conjunction with diagnostic imaging with MRI scanners for magnetic resonance angiography (MPA) and will be described with particular reference thereto. It will be appreciated, however, that the invention is also applicable to other types of magnetic resonance imaging and spectroscopy.

Magnetic resonance angiography is used to view the blood vessels of the body. Dipoles in the blood of the subject are excited and imaged as they propagate through vessels of interest. A clinician identifies various circulatory abnormalities, such as slow points or partial blockages within the vessel with the image.

Typically, a blood vessel is imaged with its flow perpendicular to the imaging slices of a slab or volume of interest. The resonance signal of the blood tends to degrade as it passes to deeper slices within the imaging region. In a typical scan of stationary tissue, dipoles are subjected to an initial excitation pulse, then to a series of refocusing pulses, as the sequence dictates. The refocusing pulses help position the dipoles such that the next excitation pulse will have greatest effect. In magnetic resonance angiography, the dipoles being imaged are in motion. A typical phenomenon is that dipoles pass from one imaging slice into another before being refocused, and into yet another slice before being subjected to subsequent excitation pulses. This results in partial saturation of the magnetic resonance signal, and manifests in signal degradation as imaging goes on. In an oblique image along the vessel, the spatially varying diameter vessel appears to taper in signal intensity across the imaging volume. Obviously this has ramifications in diagnosis, as it becomes difficult to tell the difference between a constricted vessel and an imaging artifact.

Previously, ramped RF pulses, e.g. TONE, RAMP, or VUSE RF pulses as they are known in the art, have been used to counteract such phenomena. That is, the RF pulse is designed to affect each successive slice simultaneously with a greater tip angle. As blood passes from slice to slice, the RF pulses affect the blood in such a manner to minimize signal saturation.

The slope of the ramp is determined empirically based on a simple model and assumptions, not tailored optimally or specifically to each individual subject. These pulse profiles are designed from prior tests, but are not always sufficient for eliminating saturation artifacts. Many factors ultimately affect how the blood behaves as it traverses the imaging region. These factors include, but are not limited to, patient height, weight, sex, age, profession, and blood pressure. In short, the behavior varies from patient to patient, region to region within the same patient, and can even vary from imaging session to imaging session of the same region of the same patient.

The clinician selects a ramped RF pulse sequence based on personal experience. The volume scan is conducted, typically about 8–15 minutes. If the image has artifacts that indicate that a less than optimal ramp slope was selected, the process is repeated or the diagnosis is made from flawed images.

The present invention provides a new and improved method and apparatus which overcomes the above-referenced problems and others.

SUMMARY OF THE INVENTION

In accordance with one aspect of the present invention, a magnetic imaging method is provided. Magnetic resonance is excited in a plurality of subregions, containing some measure of flowing material with radio frequency excitations having spatially adjustable tip angles. Magnetic resonance signals from the sub-regions are measured. The tip angle effected in each sub-region is adjusted according to the measured resonance. A volume image representation is generated using the adjusted tip angles.

In accordance with another aspect of the present invention, a method of magnetic resonance angiography is given. Magnetic resonance is excited in and received from a volume within a subject. A radio frequency pulse sequence is designed based on the received resonance, and used in a scan.

In accordance with another aspect of the present invention, a magnetic resonance apparatus is provided. A main magnet assembly generates a main magnetic field through a subject in an imaging region. A gradient assembly spatially encodes the main magnetic field, and a radio frequency assembly excites and manipulates magnetic dipoles within the subject. An intensity analyzer receives at least one data line from subregions of the imaging region, and determines a signal intensity for each imaging region. A radio frequency pulse sequence synthesizer adjusts tip angles of RF pulses for each subregion in accordance with measured intensities.

According to another aspect of the present invention, a magnetic resonance apparatus is provided. It includes a means for determining flow parameters of a fluid in a vessel of interest, such as flow rate, velocity, shear rate, and the like. It has a means for adjusting a radio frequency pulse profile based on the flow rate. It has a means for applying the adjusted profile and spatially encoding the fluid. It has a means for demodulating resonance signals and reconstructing them into image representations.

One advantage of the present invention resides in its improved visualization of blood vessels.

Another advantage of the present invention is reduced scan time, improving image quality vs. Scanning time efficiency.

Another advantage of the present invention is reduction of the slab-boundary artifact.

Another advantage resides in the dynamic, real time fitting of scan parameters to each patient.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
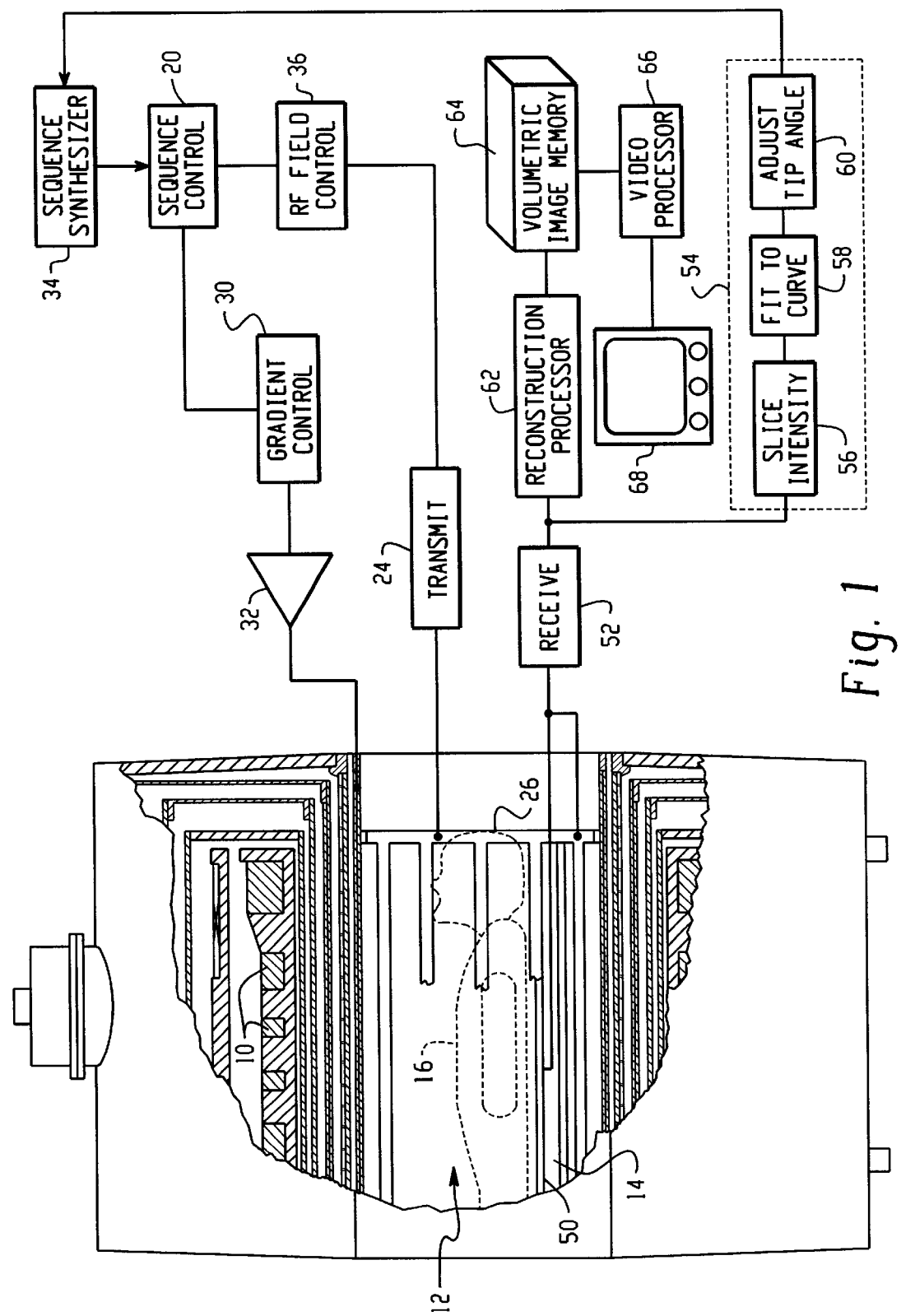
FIG. 1 is a diagrammatic illustration of a magnetic resonance apparatus in accordance with the present invention.

With reference to FIG. 1, a magnetic resonance diagnostic imaging apparatus generates a volumetric image of an internal region of the patient including a blood vessel such as the aorta or the carotid artery. The diagnostic imager, in the illustrated embodiment, is a horizontal field magnetic resonance imaging system that includes a solenoidal, preferably superconducting, magnet 10. It is to be understood that an open, vertical field magnet assembly is also applicable. The horizontal field arrangement offers higher fields and steeper gradient fields. However, an open system offers improved patient access and possible application in interventional surgery and other applications. The magnet 10 generates a horizontal magnetic field through an imaging region 12 along the axis of its bore. A patient support 14 is movable in and out of the bore to position a region of interest of a subject 16 in the imaging region 12.

Figure 2:
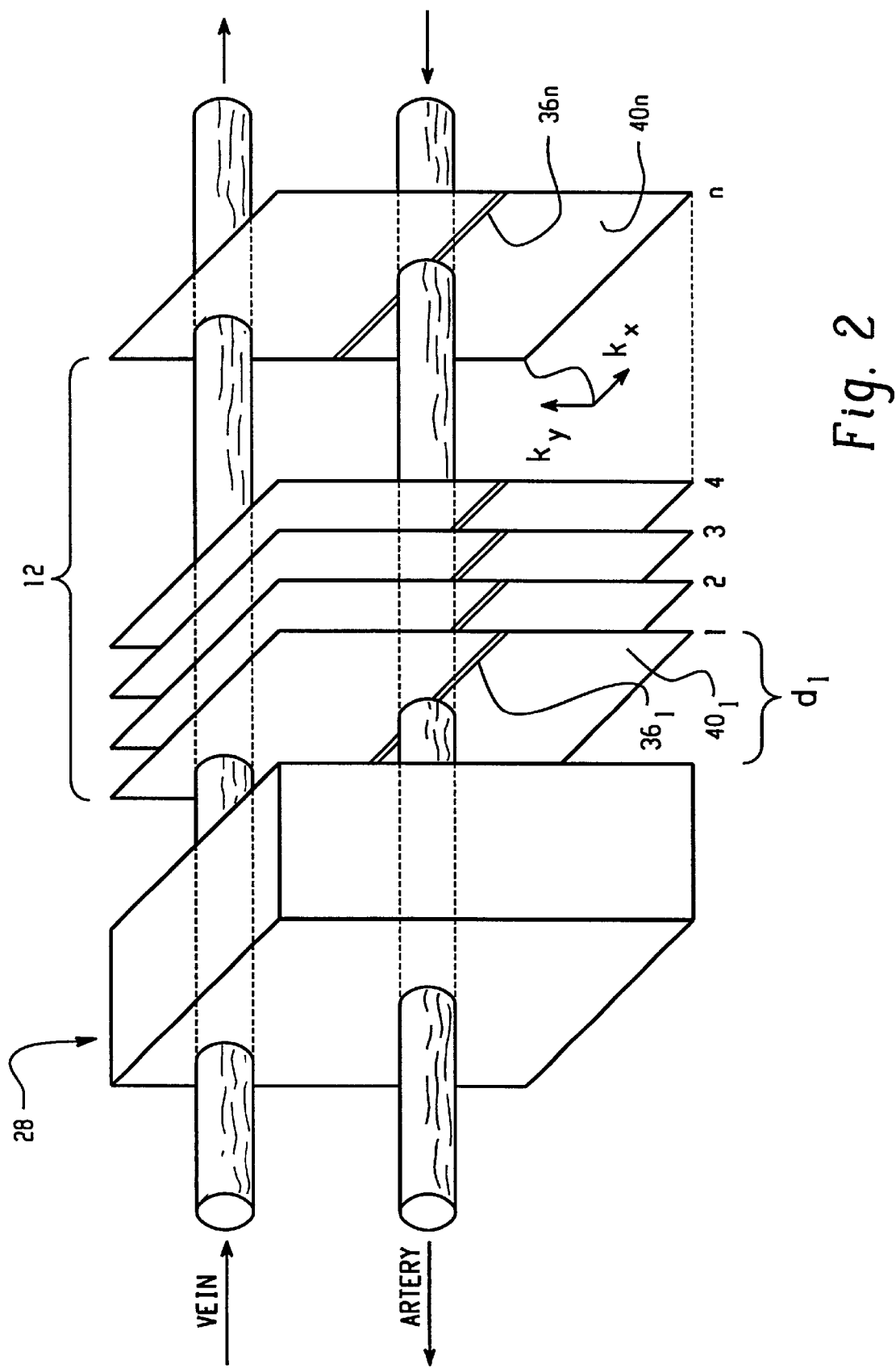
FIG. 2 is an oblique view of a vessel cut into a plurality of slices.

With continuing reference to FIG. 1 and further reference to FIG. 2, a sequence controller 20 controls a radio frequency control circuit 22 and a transmitter 24 to generate magnetic resonance excitation and manipulation pulses which are transmitted into the imaging region 12 by a whole body radio frequency coil 26. In magnetic resonance angiography, dipoles in a region 28 upstream in a flow direction from the imaging region 12 are typically pretreated. The sequence controller controls a gradient controller 30 and gradient amplifiers 32 to apply appropriate gradient pulses to limit the pretreatment to the region 28. Although a single region 28 is illustrated in FIG. 2, it is to be appreciated that pre-treatment regions can be disposed on other sides of the imaging region to pretreat blood flows from other directions. As shown in FIG. 2, the venous flow is pre-saturated which does not influence arterial flow pattern estimation. The saturated blood then flows into the imaging region. Typically, a time duration between the pretreatment and the commencement of an imaging sequence is based on the velocity of blood flow and the displacement distance $d_1$. More specifically, the time delay is typically the amount of time it takes for blood to flow from the pretreatment region to the imaging region.

As discussed above, the signal from the blood tends to diminish across the imaging region with distance from the pretreatment region 28. This diminution of signal is commonly counteracted by applying RF pulses with a greater tip angle at the far end of the imaging region relative to the slice closest to the pretreatment region. In the present application, a sequence controller 34 causes the sequence control 20 to implement a precalibration sequence. The material in the pretreatment region 28 is pretreated. After the projected time for blood to flow from the pretreatment region to the imaging region, a series of data lines are collected. More specifically to the preferred embodiment, a data line $36_1$ is collected which represents the center or $k_y=0$ data line with no phase encoding in a first slice $40_1$. This process is repeated for the central data line $36_1$–$36_n$ for each of n slices $40_1$–$40_n$.

Figure 3:
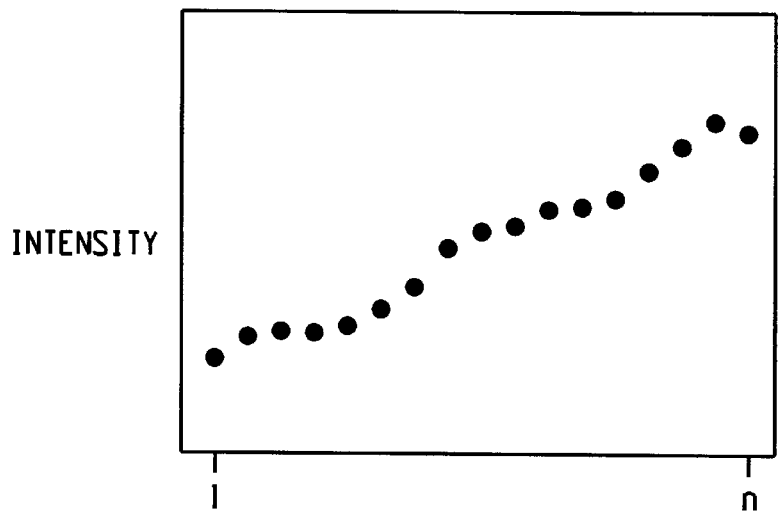
FIG. 3 is an exemplary intensity versus slice curve in accordance with the present invention.

The magnetic resonance signals with the $k_y=0$ phase encoding are received either by the whole body radio frequency coil 26 or a localized receive coil, such as coil 50. The received resonance signals are demodulated by a receiver 52 to form the data lines $36_1$–$36_n$. A processor 54 includes slice intensity calculating hardware or software 56 which calculates an intensity for each of the n slices from the data lines $36_1$–$36_n$. Curve fitting hardware or software 58 fits the intensity values for each of the n slices to a curve. An exemplary intensity versus slice curve is illustrated in FIG. 3. In the preferred embodiment, the n intensities are fit to an $n^{th}$ order polynomial. It is to be understood that a polynomial is one of many methods and algorithms that can be used to estimate flow-signal relationships. One example is the computational fluid dynamic model (CFD). Tip angle adjustment software or hardware 60 adjusts the tip angle at each slice position across the imaging volume in accordance with the curve. More specifically to the preferred embodiment, the coefficients of the nth order polynomial are used to address a look-up table which generates the tip angle correction factors which are then supplied to the sequence synthesizer 34.

Once the tip angles have been calibrated, a selected imaging sequence is conducted and the detected resonance signals are demodulated by the receiver 52 into data lines which are reconstructed by a reconstruction processor 62 into a volumetric image representation. The volumetric image representation is stored in a volumetric image memory 64. A video processor 66 withdraws selected portions of the volumetric image representation and converts them into appropriate format for display on a human-readable monitor 68 such as a video monitor, active matrix monitor, LCD display, or the like. Typical displays include selected slices, volume renderings, projections, and the like.

Looking to the preferred pre-calibration sequence in greater detail, a polynomial has the basic form:

$$\Theta(z) = c_0 + c_1 z + c_2 z^2 + \qquad (1)$$

Or more generally, $$\Theta(z) = \sum_{i=0}^{n} c_i z^i \qquad (2)$$

The value of n, also the order of the polynomial, is determined by the number of axial encoding steps $k_z$, that is, the number of slices perpendicular to a z-axis, desired in the imaging sequence. For a given number n of $k_z$ encoding steps, n linear equations can be determined. Thus, it is possible to construct a polynomial of the $n^{th}$ order. It is to be understood that a polynomial of order less than n may be used, without sacrificing observable quality. Optionally, a windowing function, that is, a function having a finite band width or discrete points, can be applied to control the transition of the slice profile.

Once the order of the polynomial is selected, a process to adaptively design and evaluate a ramped RF pulse is initiated. In the preferred embodiment, the designated phase encoded signals are collected to analyze blood flow through the imaging region in vivo. More specifically to the preferred embodiment, phase encoding is disabled, and the k=0 line of k-space is sampled in each of the slices. These values that are not phase encoded are processed into intensities. These intensity values are used to design the RF pulse with spatially dependent flip angles. Optionally, multiple iterations of this process are performed in order to optimize vascular imaging parameters more fully. Of course, the intensity versus distance from the preparation region 28 can be measured in other ways. Analogously, other localized blood velocity measurements can be used to generate values that are fit to the polynomial analogously.

Figure 4:
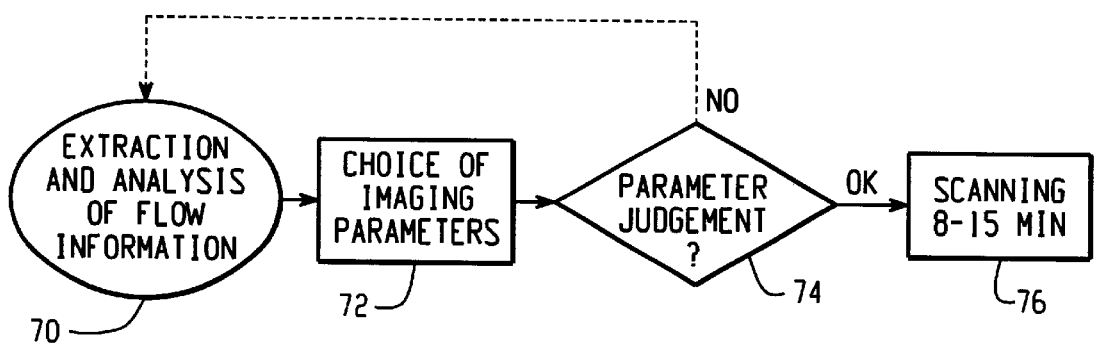
FIG. 4 is a flow diagram of a method of acquiring a magnetic resonance angiography image in accordance with the present invention.

With reference to FIG. 4, during construction of the RF pulse profile, flow information is extracted and analyzed 70. The flow information is used to design the RF pulse profile and other imaging parameters 72. The designed parameters are checked for compatibility and accuracy 74. If deemed satisfactory, the RF pulse profile is implemented in a magnetic resonance scan 76.

In addition to positional calibrating of the RF pulse, other parameters are on-the-fly calculated to improve the imaging sequence. The RF pulse duration is adjusted to reduce the dephasing effect due to flowing spins, and to reduce the peak magnetic field dose in a high field system. Another parameter that is adjusted is the amount of off-resonance excitation the RF pulse affects. That is, the frequency spectrum of the RF pulse is adjusted to affect more or fewer dipoles.

The time used for this design and evaluation process is short, relative to the length of a full scan. Depending on how many iterations are desired, a normal scan is lengthened roughly 6–12%. The time it takes to generate an image of this kind is:

$$T_{imaging} = N_Z * N_Y * T_R \quad (3)$$

where $N_Y$ is the phase encoding steps on the $k_y$ axis, $N_Z$ is the number of slices or phase encoding steps along the $k_z$ axis, and $T_R$ is the repetition time. Adding in the RF design and evaluation it becomes:

$$T_{imaging} = (N_Z + m) * N_Y * T_R \quad (4)$$

where m is the number of iterations as shown by the dashed line in FIG. 4. The change in imaging time is then:

$$\Delta T\% = \frac{(N_Z + m) * N_Y * T_R - N_Z * N_Y * T_R}{N_Z * N_Y * T_R} = \frac{m}{N_Z} \quad (5)$$

For a typical parameter setting of $N_Z=16$ and m=1, the imaging time increases by 6.25%. For $N_Z=16$ and m=2, the imaging time increases by 12.5%. Using m>2 is redundant in most situations.

In an alternate embodiment, an image using a volumetric sequence with phase encoding along the z-axis as opposed to a multiple slice sequence is generated. In this embodiment, the base function is different from the slice embodiment but again depends on velocity and vascular geometry. Typically, resonance data is generated from a slab, which is several slices thick, and which slab is disposed adjacent the preconditioning region. To image a larger volume, additional slabs contiguous to the first slab are imaged. The intensity values across each slab are retained and used to scale or otherwise match the slab images to each other. In this manner, the amount by which the slabs are overlapped for matching purposes is reduced or eliminated.

In another alternate embodiment, the operator places a region of interest in the imaging region and generates a low resolution or real time image to evaluate the level of blood flow.

In another alternate embodiment, when the wavelength becomes comparable to the size of the object, the RF excitation profile is accounted for at different field strengths. Because this method is dependent on size, other k-space trajectory, polynomial approximation, etc., can be utilized.

In another alternate embodiment, adjustments to the RF pulse profile account for deposited SAR in a region to overcome inherent limits. Preferably, on-the-fly recalculations of the RF pulse profile, dependent on the subject, field strength, and available gradient performance are made.

In another alternate embodiment, a library or look-up-table is used. Based on a known geometry, preferred models are stored in a memory. The nearest match is chosen when the initial time boundary conditions are generated, to save the computation of designing an RF sequence on-the-fly. Optimization can be used to improve the model.

In another alternate embodiment, navigator echos are used to predict blood velocity vectors in the imaging region. From that information, the preconditioning region is positioned and dimensioned and RF pulse profiles are designed.

In yet another alternate embodiment, non-MRI methods such as ultrasound or laser Doppler can be used to generate an assessment of blood flow within the imaging region. This information then is fed back into the MRI system for generation of the RF pulse profile.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic imaging method comprising:
   in each of a plurality of subregions of a region of interest, generating magnetic resonance signals in selected dipoles in the region of interest, at least some of the selected dipoles being in flowing material, the generating of magnetic resonance signals including applying at least one of radio frequency excitation and resonance manipulation pulses with a spatially adjustable tip angle;
   measuring an intensity of the magnetic resonance signals from each of the subregions;
   adjusting the tip angle of the radio frequency pulses corresponding to each subregion in accordance with differences in the measured intensities; and,
   generating a volumetric image representation of the region of interest using the dynamically adjusted RF profiles based on subject-dependent calibration data.

2. The method as set forth in claim 1 wherein the flowing material flows along a tube and wherein the subregions are disposed serially along the tube.

3. The method as set forth in claim 1 wherein the subregions are slices.

4. The method as set forth in claim 3 wherein the step of generating the image representation includes phase and frequency encoding magnetic resonance in orthogonal directions across each slice.

5. The method as set forth in claim 4 wherein the step of generating magnetic resonance signals from each of the slices includes collecting at least a single data line from each slice with a common phase encoding.

6. The method as set forth in claim 1 further including:
   generating a second volumetric image representation in a second region of interest adjacent the first volumetric image representation;
   adjusting at least one of the volumetric image representations in accordance with a difference in the measured intensities of the first and second regions of interest.

7. A method of magnetic resonance angiography comprising:
   exciting magnetic resonance in a volume of a subject;
   receiving magnetic resonance signals from selected dipoles in subvolumes in the volume;
   determining an intensity of the received resonance signals from each subregion;
   fitting variations in the determined signal intensities to a polynomial;
   selecting RF pulse profiles which vary across the volume in accordance with the polynomial; and, conducting an imaging scan of the volume with a radio frequency pulse sequence which incorporates the selected RE pulse profiles.

8. The method as set forth in claim 7, wherein the step of exciting magnetic resonance includes:
   exciting a slice having a thickness and containing a portion of a blood vessel of interest.

9. The method as set forth in claim 7, wherein the step of receiving magnetic resonance signals comprises:
   partitioning the volume into a plurality of one of slices and slabs;
   collecting a line of k-space data from each of the plurality of slices; and,
   from the lines of k-space data, determining differences in a signal intensity from slice to slice.

10. The method as set forth in claim 7 wherein the polynomial is one of a first, second, and third order polynomial.

11. A method of magnetic resonance angiography comprising:
   exciting magnetic resonance in a volume of a subject;
   receiving magnetic resonance signals from selected dipoles within the volume including:
      partitioning the volume into a plurality of one of slices and slabs;
      collecting a line of kspace data from each of the plurality of slices or slabs;
      from the lines of kspace data, determining differences in a signal intensity from slice to slice or slab to slab;
   designing a radio frequency pulse sequence based on the received magnetic resonance signals including:
      analyzing a tip angle saturation factor;
      constructing an RF pulse sequence from the intensity differences that does not saturate tip angles; and
   conducting an imaging scan using the designed radio frequency pulse sequence.

12. The method as set forth in claim 11 wherein the step of conducting the imaging scan includes:
   at least one of exciting and manipulating resonance in each slice with radio frequency pulses with the corresponding tip angle to generate magnetic resonance signals;
   demodulating the magnetic resonance signals into data lines;
   reconstructing the data lines into an image representation.

13. The method as set forth in claim 14 further including:
   prior to exciting or manipulating resonance in the slices, exciting and manipulating resonance in an adjacent region.

14. A method of magnetic resonance angiography comprising:
   partitioning a volume into a plurality of one of slices and slabs;
   exciting resonance in the volume and collecting k-space data spanning the volume;
   from the kspace data, determining differences in a signal intensity across the volume;
   selecting an RF tip angle for each slice or slab in accordance with the determined intensity differences; and
   implementing an imaging scan with a radio frequency pulse sequence having the selected tip angles.

15. The method of claim 14 wherein the selecting step includes:
   fitting an RF profile to the determined intensities.

16. The method as set forth in claim 14 wherein the step of collecting the k-space data includes:
   collecting a k=0 line of k-space from each of the plurality of slices or slabs.

17. A magnetic resonance apparatus comprising:
   a main magnet assembly for generating a main magnetic field through an imaging region wherein is located a subject;
   a gradient coil assembly which spatially encodes the main magnetic field;
   a radio frequency coil assembly which excites and manipulates magnetic resonance in selected dipoles of the subject with radio frequency pulses;
   a receiver which receives magnetic resonance signals from the resonating dipoles and generates corresponding data lines;
   an intensity analyzer which receives at least one data line from each of a plurality of subregions of the imaging region and determines a signal intensity for each subregion;
   a radio frequency pulse sequence synthesizer which adjusts a tip angle of radio frequency pulses for each subregion in accordance with the signal intensity determined for each subregion.

18. The magnetic resonance apparatus as set forth in claim 16 further including:
   a curve fitting processor which fits the intensity values to coefficients of a curve;
   a look-up table addressed by the coefficients to retrieve radio frequency pulse tip angles.

19. A magnetic resonance apparatus comprising:
   a means for determining a flow rate of a fluid at selected points along a vessel of interest;
   a means for determining a geometry of the vessel;
   a means for adjusting a radio frequency pulse profile based on the flow rates and geometry;
   a means for applying the profile adjusted radio frequency pulses and spatially encoding pulses to the vessel of interest to generate spatially encoded magnetic resonance signals in the fluid;
   a means for demodulating the resonance signal to generate data lines;
   a means for reconstructing the data lines into an image representation.

20. The magnetic resonance apparatus as set forth in claim 19 wherein the flow rate determining means includes:
   a means for controlling the radio frequency and spatial encoding pulse applying means to manipulate resonance in fluid in the vessel upstream of the selected points along the vessel and to generate resonance signals at each selected point;
   a means for analyzing data lines from each of the selected points to determine signal intensity from each point.

21. The magnetic resonance apparatus as set forth in claim 20 wherein the radio frequency pulse adjusting means includes means for adjusting a tip angle of the radio frequency pulses in accordance with the determined signal intensities.

22. A magnetic imaging apparatus comprising:
   a means for generating magnetic resonance signals in selected dipoles in each of a plurality of subregions of a region of interest, at least some of the selected dipoles being in flowing material, by applying at least one of radio frequency excitation and resonance manipulation pulses with a spatially adjustable tip angle;

a means for measuring an intensity of the magnetic resonance signals from each of the subregions;

a means for adjusting the tip angle of the radio frequency pulses corresponding to each subregion in accordance with differences in the measured intensities; and, a means for generating a volumetric image representation of the region of interest using the dynamically adjusted RF profiles based on subject-dependent calibration data.

23. A magnetic resonance method comprising:

generating a main magnetic field through an imaging region in which a subject is located;

spatially encoding the main magnetic field;

exciting and manipulating magnetic resonance in a volume of interest of the subject with a calibration pulse sequence to encode at least one data line in each of a plurality of subregions of the region of interest;

receiving the magnetic resonance signals and determining a signal intensity for each subregion from the data lines;

selecting tip angles for radio frequency pulses to be applied across the region of interest in an imaging sequence in accordance with the intensity determined for each subregion;

conducting a magnetic resonance imaging sequence utilizing the selected tip angles to generate a volumetric image data set;

reconstructing the volumetric image data set into a volumetric image representation of the region of interest.

24. The method as set forth in claim 22 wherein the tip angle selecting step includes:

fitting the intensities for each subregion to coefficients to a curve;

addressing a look-up table with the coefficients to retrieve the selected tip angles.

25. A magnetic resonance imaging method comprising:

determining flow rates of a fluid at selected points along a vessel in a region of interest;

determining a geometry of the vessel;

adjusting a radio frequency pulse profile based on the determined flow rates and the determined geometry;

applying the profile adjusted radio frequency pulses and spatial encoding pulses to the region of interest to generate spatially encoded magnetic resonance signals from the vessel and fluid flowing in the vessel;

demodulating the resonance signal; and reconstructing the demodulated magnetic resonance signals into an image representation of the vessel and the fluid.

26. The method as set forth in claim 25 wherein the step of determining the flow rate includes:

exciting magnetic resonance in the fluid in the vessel upstream from a region of interest;

receiving magnetic resonance signals from the fluid in which the magnetic resonance signals have been excited as the fluid flows through the vessel in the region of interest;

analyzing a signal intensity of the received magnetic resonance signals at the selected points along the vessel in the region of interest.

* * * * *